United States Patent [19]
Meister et al.

[11] Patent Number: 5,177,582
[45] Date of Patent: Jan. 5, 1993

[54] CMOS-COMPATIBLE BIPOLAR TRANSISTOR WITH REDUCED COLLECTOR/SUBSTRATE CAPACITANCE AND PROCESS FOR PRODUCING THE SAME

[75] Inventors: Thomas Meister, Taufkirchen; Hans-Willi Meul, Bruckmühl; Helmut Klose, München; Hermann Wendt, Neukeferloh, all of Fed. Rep. of Germany

[73] Assignee: Siemens Aktiengesellschaft, Munich, Fed. Rep. of Germany

[21] Appl. No.: 754,377

[22] Filed: Aug. 30, 1991

Related U.S. Application Data

[63] Continuation of Ser. No. 586,692, Sep. 24, 1990, abandoned.

[30] Foreign Application Priority Data

Sep. 22, 1989 [EP] European Pat. Off. ........ 89117580.4

[51] Int. Cl.⁵ ..................... H01L 29/72; H01L 29/04; H01L 23/48
[52] U.S. Cl. ..................................... 257/588; 257/49; 257/773
[58] Field of Search .............................. 357/34, 59, 72

[56] References Cited

U.S. PATENT DOCUMENTS

| | | | |
|---|---|---|---|
| 4,703,554 | 11/1987 | Havemann | 357/34 |
| 4,710,241 | 12/1987 | Komatsu | 357/34 |
| 4,860,077 | 8/1989 | Reuss et al. | 357/34 |
| 4,914,048 | 4/1990 | Scovelle et al. | 357/34 |
| 4,974,045 | 11/1990 | Okita | 357/34 |

FOREIGN PATENT DOCUMENTS

| | | | |
|---|---|---|---|
| 60-117664 | 6/1985 | Japan | 357/34 |
| 63-215069 | 9/1988 | Japan | 357/34 |

OTHER PUBLICATIONS

*Journal de Physique*, Sep. 1988, ESSDERC 88, European Solid State Device Research Conference, H. Klose et al.: "Well -Optimization for High Speed BICMOS Technologies".

K. O. Kenneth et al., *IEEE Transelectron Dev.* Bd. 36, (1989), pp. 1362-1369.

A. W. Wieder, *Siemens Forsch–uentwickl–Ber*, Bd. 13, (1984), No. 5, pp. 246-252.

J. N. Burghartz et al., *IEEE Electron Dev. Letters*, vol. 9, No. 5, May 1988, pp. 259-261.

T. C. Chen, et al., *IEDM Technical Digest* 88, pp. 740-743.

D. L. Harame et al., *IEEE Electron Dev. Letters*, vol. 10, No. 4, Apr. 1989, pp. 156-158.

L. C. Parrillo et al., *IEDM Technical Digest* 1980, pp. 752-755.

M. L. Chen et al., *IEDM Technical Digest*, 1986, pp. 256-259.

H. Klose et al., "Well optimization for high speed BICMOS Technologies" ESSDERC 88, pp. 97-100.

*Primary Examiner*—J. Carroll
*Attorney, Agent, or Firm*—Herbert L. Lerner; Laurence A. Greenburg

[57] ABSTRACT

A bipolar transistor with a collector, a base and an emitter disposed in vertical succession includes a semiconductor substrate, insulating oxide zones disposed in the substrate for separating adjacent transistors, and a buried collector terminal layer at least partly disposed on the insulating oxide zones. An insulator structure laterally surrounding a collector. A subcollector is surrounded by the insulating oxide zones, has the same conductivity type with a lower impedance than the collector, is disposed under the collector and under the insulator structure, and is electrically connected to the collector. The insulator structure covers the buried collector terminal layer, laterally insulates the collector from the buried collector terminal layer, and has lateral surfaces extending inside the insulating oxide regions up to the subcollector. The buried collector terminal layer is in direct contact with the subcollector. The collector is electrically connected to the buried collector terminal layer only through the subcollector. The insulator structure has a contact hole extending to the buried collector terminal layer laterally of the active transistor zone, and a metallization filling the contact hole. A process for producing the bipolar transistor includes producing an insulator structure on a substrate for determining a location for a collector; and producing the collector by selective epitaxy only inside the insulator structure, for laterally insulating the collector with the insulator structure. An integrated circuit and method include such bipolar transistors and CMOS transistors.

5 Claims, 9 Drawing Sheets

CMOS-COMPATIBLE BIPOLAR TRANSISTOR WITH REDUCED COLLECTOR/SUBSTRATE CAPACITANCE AND PROCESS FOR PRODUCING THE SAME

This application is a continuation of application Ser. No. 07/586.692 filed Sep. 24, 1990, now abandoned.

The invention relates to a bipolar transistor having a collector, a base and an emitter disposed in vertical succession, as well as a process for producing the bipolar transistor.

Modern bipolar transistors, such as those described by A. W. Wieder in Siemens Forschungs- und Entwicklungsberichte Ä Research and Development ReportsÜ, Vol. 13, 1984, pp. 246 et seq., have two separate silicon islands for connecting the collector and for the active transistor zone. Such silicon islands are joined to one another by a highly doped buried layer, also known as a subcollector. The subcollector is usually generated by implantation in a substrate. An epitaxial layer for the active transistor zone is then deposited thereon. The production of the oxide insulator and structuring of the subcollector with a deep trench insulator follows. In that configuration, the large amount of space required by the subcollector determines the transistor size and the parasitic collector/substrate capacitance.

In the construction of BICMOS circuits, in other words circuits that include both bipolar transistors and CMOS transistors and thus combine the advantages of both technologies, producing the insulator only after the epitaxial deposition of the active transistor zones of the bipolar transistors has decisive disadvantages. Specifically, the CMOS transistors are forced to have the flat epitaxial layer of the bipolar transistor and the same location of the subcollector with respect to the silicon surface. Therefore, the speed potential of the bipolar transistors cannot be utilized without considerable degradation of the drain/well capacitance of the transistor, which is of the p-channel type, for example. (For example, see H. Klose et al, "Well Optimization for High Speed BICMOS Technologies", ESSDERC 88.) Using the flat epitaxial layer with a thickness of only approximately 1 to 1.5 $\mu$m, which is unusual for a CMOS process, necessitates a readjustment of the well profile.

In the manufacturing process for a BICMOS circuit, the production steps for the bipolar components have a considerable influence on the CMOS components. It is accordingly impossible to introduce a time-tested bipolar concept into a BICMOS process without having to expend considerable development effort on the CMOS process.

In IEEE Transactions on Electronic Devices, Vol. 36 (1989), pp. 1362 et seq., K. O. Kenneth et al disclose a bipolar transistor in which the active transistor zones are produced on the subcollector by selective epitaxy. The collector terminal is made directly on the subcollector. Neither the base terminal zone nor the entire collector terminal zone is dielectrically insulated from the silicon. Although that bipolar transistor is suitable for a BICMOS process, since (because of selective epitaxy!) its epitaxial layer is no longer compulsory for the CMOS transistors, the inadequate insulation of the base and collector terminal zones nevertheless engenders high parasitic capacitances, which make such transistors unsuitable for high-speed applications. Moreover, for a given current density, such transistors have a high power loss and thus low values for the power-delay product.

It is accordingly an object of the invention to provide a CMOS-compatible bipolar transistor with reduced collector/substrate capacitance and a process for producing the same, which overcome the hereinafore-mentioned disadvantages of the heretofore-known methods and devices of this general type, which provides a bipolar transistor that can be integrated into a BICMOS process without affecting the CMOS components and that has reduced parasitic capacitances, especially a reduced substrate/collector capacitance, and which provides a production process that can be integrated into a BICMOS process.

With the foregoing and other objects in view there is provided, in accordance with the invention, a bipolar transistor having a collector, a base and an emitter disposed in vertical succession, comprising:

a) a semiconductor substrate, insulating oxide zones disposed in the semiconductor substrate for separating adjacent transistors with an active transistor zone, a buried collector terminal layer at least partly disposed on the insulating oxide zones;

b) a collector, an insulator structure laterally surrounding the collector, a subcollector being surrounded by the insulating oxide zones, having the same conductivity type with a lower impedance than the collector, being disposed under the collector and under the insulator structure, and being electrically connected to the collector;

c) the insulator structure covering the buried collector terminal layer, laterally insulating the collector from the buried collector terminal layer, and having lateral surfaces extending inside the insulating oxide regions up to the subcollector;

d) the buried collector terminal layer being in direct contact with the subcollector, and the collector being electrically connected to the buried collector terminal layer only through the subcollector;

e) the insulator structure having a contact hole formed therein extending to the buried collector terminal layer laterally of the active transistor zone, and a metallization filling the contact hole.

A connection with as little impedance as possible is attained through the use of an annular disposition of the buried collector terminal layer around the collector. Tungsten, polycide, highly doped polysilicon, silicide or the like, for instance, are suitable for the collector terminal layer.

It is within the scope of the invention to make the connection between the buried collector terminal layer and the collector by means of a subcollector. The subcollector is highly doped with the same conductivity type as the collector.

Since the collector connection is effected through the buried collector terminal layer, a surface area is required for the subcollector that is only slightly larger than that for the active collector. The contact surface between the buried region and the substrate results in the collector/substrate capacitance. Since the buried collector terminal layer is substantially disposed on the insulating oxide zones, it also does not make any notable contribution to the collector/substrate capacitance.

The active transistor zone is produced in the transistor according to the invention by selective epitaxy.

In accordance with another feature of the invention, in one embodiment, the subcollector is disposed in the substrate. In the substrate, the subcollector is surrounded by the insulating oxide zones. In this case the subcollector is produced by implantation or out-diffusion from a conductive layer disposed above it. If the subcollector is produced by out-diffusion from the conductive layer, then it is advantageous to form the buried collector terminal layer from the conductive layer. The collector is disposed as either aligned or self-aligned relative to the collector terminal.

In accordance with a further feature of the invention, in another embodiment, the subcollector is disposed on the substrate. In this case, a silicon layer is applied over the entire surface area of the substrate having the insulating oxide regions, in such a way that on the insulating oxide region it grows in polycrystalline fashion but on the exposed substrate surface it grows in monocrystalline fashion. It is suitable to deposit the silicon layer with in-situ doping and as low impedance as possible. An adequately low-impedance property can also be attained by coating with doped atoms (for instance from glass implanted with dopant atoms, or oxide). In-situ doped deposition or inward diffusion of dopant atoms avoids crystal defects in a subsequent implantation. After a structuring operation, the portion of the applied silicon layer disposed on the insulating oxide zones forms the buried collector terminal layer, and the monocrystalline portion disposed on the substrate surface forms the subcollector. In this configuration, the buried collector terminal layer is disposed entirely on the insulating oxide zones. The boundary surface between the subcollector and the substrate is kept minimal. With this configuration, a minimized parasitic collector/substrate capacitance is therefore attained.

The insulator structure surrounding the collector is produced on the collector terminal layer. The collector is produced by selective epitaxy inside the insulator structure.

The emitter/base complex is mounted on the resultant structure. Various embodiments are naturally possible for the emitter/base complex.

In accordance with an added feature of the invention, one possibility is, for instance, to produce the base terminal as being self-aligned to the active transistor by means of an internal spacer as seen, for example, from the article by A. W. Wieder in Siemens Forschungs- und Entwicklungsberichte [Research and Development Reports], Vol. 13, 1984, pp. 246 et seq., and the article by J. N. Burghartz et al in IEEE Electronic Device Letters, Vol. 9 (1988), pp. 259 et seq.. In this internal spacer concept, the production of the base can be carried out by implantation, out-diffusion, or selective deposition. Another option is to produce the emitter/base complex in the manner disclosed by T. C. Chen et al in IEDM Technical Digest 1988, pp. 740 et seq. and by D. L. Harame et al in IEEE Electronic Device Letters, Vol. 10 (1989), pp. 156 et seq., by self-alignment of the base terminal with an external spacer.

Since the active collector is produced by selective epitaxy after the insulating oxide zones are finished in the substrate in the bipolar transistor according to the invention, the bipolar transistor according to the invention can be integrated into BICMOS concepts. The bipolar production is performed completely independently of the CMOS production. Bipolar components and CMOS components can be optimized independently of one another. The bipolar transistor according to the invention can therefore be added to any CMOS process without requiring further development work on the CMOS process itself.

With the foregoing and other objects in view there is furthermore provided, in accordance with the invention, a process for producing a bipolar transistor having a collector, a base and an emitter disposed in vertical succession, which comprises producing an insulator structure on a substrate for determining a location for a collector; and producing the collector by selective epitaxy only inside the insulator structure, for laterally insulating the collector with the insulator structure.

With the objects of the invention in view, there is also provided a process for the production of a BICMOS circuit having at least one bipolar transistor, which comprises placing the conductive layer over the entire surface after the channel implantation and the production of the gate oxides for the CMOS transistors, structuring the conductive layer for creating the gate electrodes and the region of the conductive layer required for the bipolar transistor production from it, and covering the finished processed CMOS transistors with the insulation layer from which the insulator structure surrounding the collector is produced.

With this simultaneous use of the conductive layer as a gate electrode and as a buried collector terminal layer, one mask is dispensed with in the production process.

Other features which are considered as characteristic for the invention are set forth in the appended claims.

Although the invention is illustrated and described herein as embodied in a CMOS-compatible bipolar transistor with reduced collector/substrate capacitance and a process for producing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
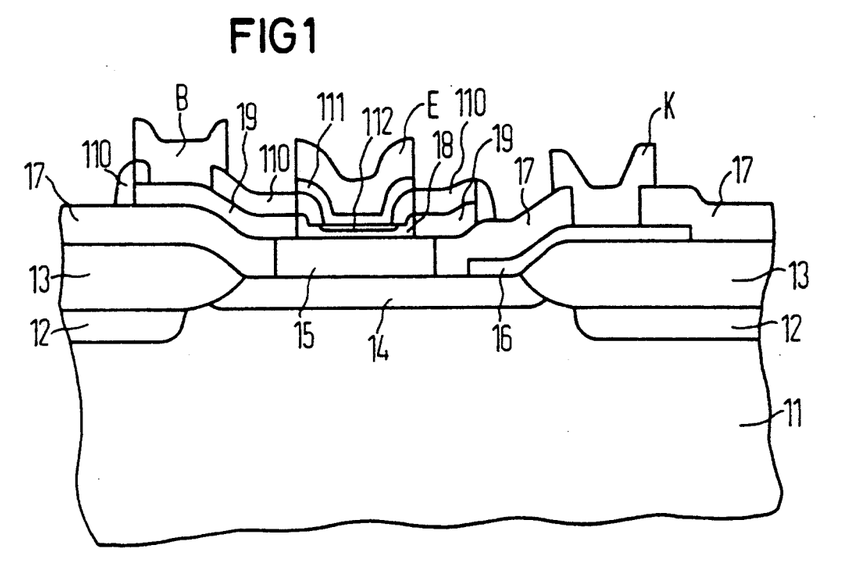
FIGS. 1-4 are fragmentary, diagrammatic, cross-sectional views showing various embodiments of the bipolar transistor according to the invention.

Referring now to the figures of the drawings in detail and first, particularly, to FIG. 1 thereof, there are seen channel stopper zones 12 which are doped into a high-impedance substrate 11 that has p-doping, for instance. Insulating oxide zones 13 are disposed above the channel stopper zones 12. A LOCOS insulator or a box insulator, for instance, is used as the insulating oxide zone 13. A subcollector 14 is disposed in the substrate 11 between the insulating oxide zones 13. The subcollector 14 is $n^+$-doped, for example.

A collector 15 is disposed above the subcollector 14. The collector 15 is $n^-$-doped, for example. A buried collector terminal layer 16 is disposed on the subcollector 14 laterally of the collector 15. The buried collector terminal layer 16 is disposed in such a way that it is only in contact with the collector 15 through the subcollector 14. The buried collector terminal layer 16 also extends over the insulating oxide zone 13 which is disposed next to the subcollector 14. The buried collector terminal layer 16 is electrically conductive. For instance, the buried collector layer 16 may be formed of $n^-$-doped polysilicon, a silicide, polycide, tungsten, or the like.

The collector 15 is surrounded by an insulator structure 17. In height, the insulator structure 17 and the collector 15 are approximately flush with one another. The insulator structure 17 is formed of silicon oxide, for instance. The insulator structure 17 extends laterally past the insulating oxide zones 13. The insulator structure 17 completely covers the collector terminal layer 16. A contact hole with a metallization in the form of a collector contact K, is located above both the collector terminal layer 16 and the insulating oxide zone 13 underneath the layer 16. A base 18 is disposed on the collector 15. The base 18 is annularly surrounded by a base terminal 19. The base terminal 19 is formed of $p^+$-doped polysilicon, for instance. The base terminal 19 is substantially disposed on the insulator structure 17.

An oxide film 110, which completely covers the base terminal 19, is provided. The oxide film 110 defines an opening above the base 18. An emitter terminal 111 of $n^-$-doped polysilicon is disposed on the opening. An emitter 112 is produced from the emitter terminal 111 by out-diffusion. A contact hole which is filled with a metallization forming a base contact B, is provided in the oxide film 110. A metallization is provided as an emitter contact E on the emitter terminal 111.

Since the buried collector terminal layer 16 extends partly over the insulating oxide zone 13, both the surface area of the subcollector 14 and thus the parasitic/substrate capacitance are reduced, as compared with the prior art.

Figure 2:
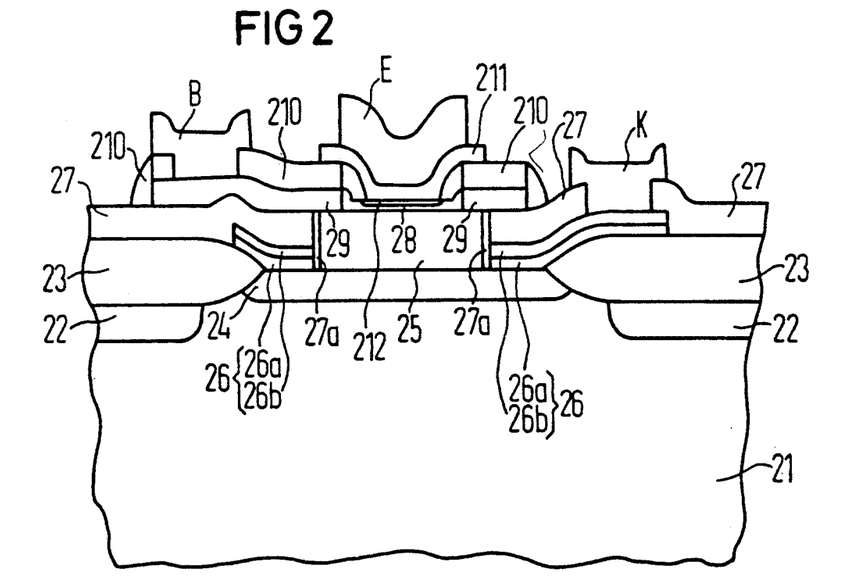

According to a further embodiment of a bipolar transistor according to the invention, as seen in FIG. 2, channel stopper zones 22 are disposed in a substrate 21, which is p-conducting and of high impedance. Insulating oxide zones 23 are disposed above the channel stopper zones 22. A subcollector 24, which is surrounded by the insulating oxide zones 23, is disposed in the semiconductor substrate 21. The subcollector 24 is $n+$-conducting, for example. A collector 25 that is $n^-$-doped is disposed on the subcollector 24. An annular buried collector terminal layer 26 is disposed around the collector 25. The buried collector terminal layer 26 is constructed as a double layer which includes one $n^-$-doped polysilicon layer 26a, and a metal silicide layer 26b disposed thereon. The polysilicon layer 26a is connected directly to the subcollector 24. Insulating spacers 27a, which may be formed of silicon oxide or silicon nitride, are provided between the buried collector terminal layer 26 and the collector 25. As a result, the collector 25 is only connected to the buried collector terminal layer 26 through the subcollector 24. Due to the annular disposition of the buried collector terminal layer, an adequately low collector track resistance is achieved, even with a flat subcollector 24 having a depth of only 100 nm, for example, without increasing the amount of space required for the transistor or increasing the parasitic collector/substrate capacitance.

An insulator structure 27, which may be formed of silicon oxide, is disposed above the buried collector terminal layer 26. The insulator structure 27 is flush in height with the insulating spacers 27a and the collector 25. A contact hole that is filled with a metallization forming a collector contact K, is provided in the insulator structure 27.

A base 28 with p-doping, for instance, is disposed on the collector 25. The base 28 is annularly surrounded by a base terminal 29, which is $p^-$-doped, for instance, and is formed of polycrystalline silicon. The base terminal 29 is covered with an oxide film 210, which has an opening defining the emitter zone. Disposed on the oxide film 210 is an emitter terminal 211, which is formed of $n^-$-doped polysilicon. An emitter 212 is generated on the emitter terminal 211 by out-diffusion. A contact hole that is filled with a metallization forming the base contact B is provided in the oxide film 210. A metallization is disposed on the emitter terminal 211 as an emitter contact E.

The FIG. 2 embodiment has the advantage of permitting the collector 25 to be produced in a self-aligned manner with respect to the buried collector terminal layer 26. In order to provide self-aligned production, the buried collector terminal layer 26 is structured with the same photo technique with which the insulator structure 27 is produced. After the insulating spacers 27a is produced, the collector 25 is produced by selective epitaxy.

Figure 3:
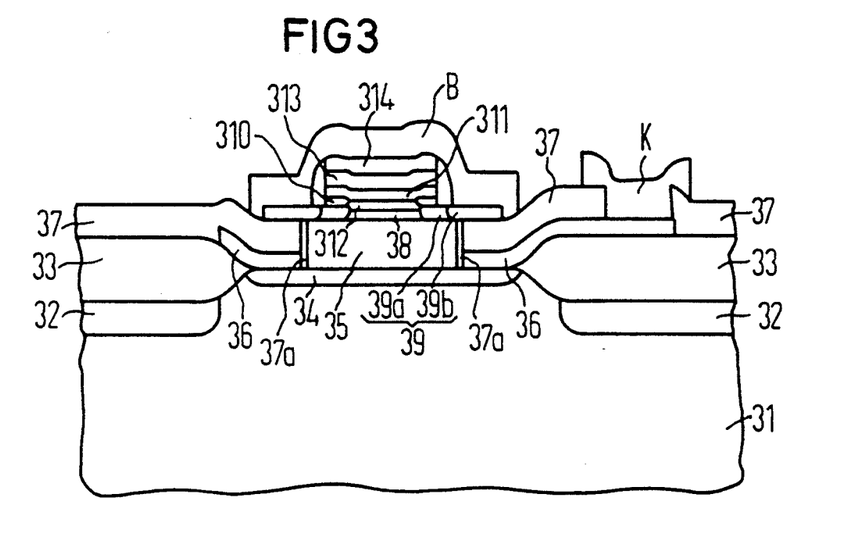

FIG. 3 shows a further embodiment of a transistor according to the invention. Channel stopper zones 32 are again disposed in a substrate 31, which has high impedance and p-doping. Insulating oxide zones 33 are disposed above the channel stopper zones 32. A subcollector 34 with $n^-$-doping is disposed between the insulating oxide zones 33. A collector 35 with $n^-$-doping is disposed on the subcollector 34. The collector 35 is surrounded by lateral surface insulators 37a which, for instance, are formed of silicon oxide or silicon nitride. A buried collector terminal layer 36 is disposed in such a way as to be self-aligned with respect to the collector 35 and outside lateral surface insulators 37a that annularly surround the collector 35. For instance, the collector terminal layer 36 may be formed of metal silicide. The buried collector terminal layer 36 is disposed partly on the subcollector 34, with which it is connected, and partly on the insulating oxide zone 33. The collector 35 is connected to the buried collector terminal layer 36 through the subcollector 34.

Disposed on the buried collector terminal layer 36 is an insulator structure 37 which is formed of silicon oxide, for instance, and is flush in height with the insulating spacers 37a and the collector 35. A contact hole which is provided in the insulator structure 37, extends to the buried collector terminal layer 36 and is filled with a metallization forming a collector contact K thereof. The complex described thus far is similar in structure to the corresponding complex of the exemplary embodiment shown in FIG. 2.

A base 38 is disposed on the collector 35. The base 38 is p-doped, for instance. The base 38 is surrounded by a base terminal 39. The base terminal 39 is formed of a first base terminal zone 39a and a second base terminal zone 39b. The first base terminal zone 39a annularly surrounds the base 38. The first base terminal zone 39a has $p^+$-doping. The first base terminal zone 39a is in turn annularly surrounded by the second base terminal zone 39b, which has $p^{++}$-doping.

Disposed on the base terminal 39 is an oxide film 310, which is structured in such a way that it reliably covers the boundary zone between the base 38 and the first base terminal zone 39a. The oxide film 310 is also structured in such a way that the second base terminal zone 39b, which has a $p^{--}$-doping, is not covered by the oxide film 310. Disposed on the oxide film 310 is an emitter terminal 311, which is formed of $n^-$-doped polysilicon and is flush with the outer edges of the oxide film 310. An emitter 312 is produced on the base by out-diffusion from the emitter terminal 311. Disposed on the emitter terminal 311 is a metal silicide layer 313, on which an emitter contact extends outside the plane of the drawing. The metal silicide layer 313 and the emitter terminal 311 are completely covered over by an oxide structure 314. The oxide structure 314 is formed of a layer covering the metal silicide layer 313 and lateral surfaces covering the lateral surfaces. A metal base contact is provided, which covers the entire exposed region of the second base terminal zone 39b and first base terminal zone 39a as well as the oxide structure 314.

Figure 4:
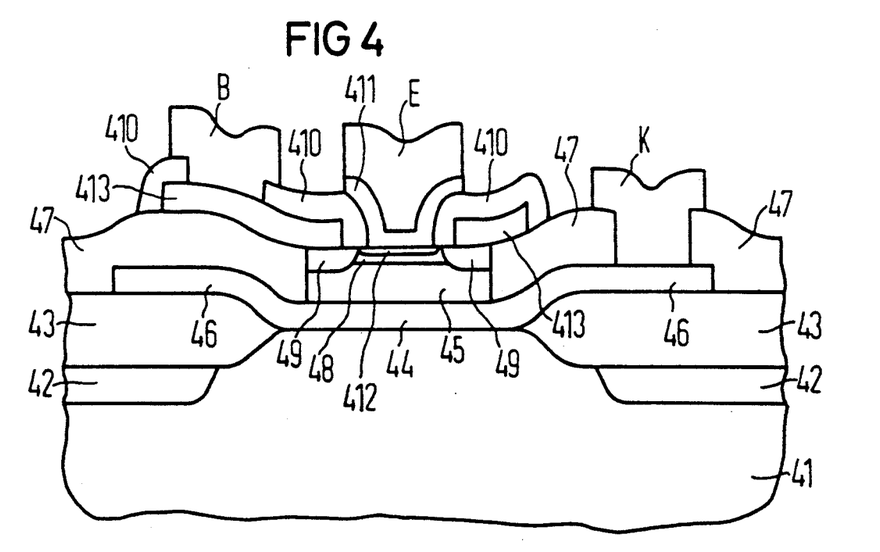

FIG. 4 shows a further embodiment of a transistor according to the invention. Channel stopper zones 42 are provided in a substrate 41, which is p-doped and has high impedance. Insulating oxide zones 43 are disposed above the channel stopper zones 42. The insulating oxide zones 43 define a free region of the surface of the semiconductor substrate 41. A subcollector 44 is disposed on the surface of the semiconductor substrate 41. The subcollector 44 is surrounded by a buried collector terminal layer 46. The subcollector 44 and the buried collector terminal layer 46 are produced by simultaneous epitaxial and polycrystalline silicon deposition and are doped in situ in the course of deposition. Another option for doping the subcollector 44 and the collector terminal 46 is to apply a further layer (such as doped glass, oxide, $n^-$-polysilicon, etc.) and then to eliminate this layer again after the dopant has been driven in. In the simultaneous epitaxial and polycrystalline deposition, the subcollector 44, which is disposed on the surface of the monocrystalline silicon substrate 41, grows in monocrystalline fashion, while the buried collector terminal layer 46, which is disposed on the insulating oxide zones 43, grows in polycrystalline fashion.

A collector 45 is disposed on the subcollector 44. The collector 45 is $n^-$-doped. The collector 45 is surrounded by an insulator structure 47. The collector 45 is followed by a base 48, which is annularly surrounded by a base terminal 49. The base 48 is p-doped and the base terminal 49 is $p^-$-doped. An n-doped emitter 412 is disposed above the base 48 inside the base terminal 49. The insulator structure 47 is flush in height with the base terminal 49 and the emitter 412.

A contact hole which is provided in the insulator structure 47 extends to the buried collector terminal layer 46 and is filled with a metallization forming a collector contact K.

A $p^+$-doped polysilicon layer 413 is disposed at the boundary between the base terminal 49 and the insulator structure 47. The base terminal 49 is produced by out-diffusion from the $p^+$-doped polysilicon layer 413. The $p^+$-doped polysilicon layer 413 extends on the insulator structure 47 far enough on at least one side, to ensure that bonding of the base terminal 49 is possible there. The $p^-$-doped polysilicon layer 413 is completely covered with an oxide film 410. The oxide film 410 leaves the surface of the emitter 412 uncovered. An emitter terminal 411 that is formed of $n^-$-doped polysilicon is disposed on the oxide film 410 and on the surface of the emitter 412. The emitter 412 is produced by out-diffusion from the emitter terminal 411.

A contact hole that extends to the $p^-$-doped polysilicon layer 413 and is filled with a metallization forming the base contact B, is provided in the oxide film 410. The emitter terminal 411 is covered with a metallization in the form of an emitter contact E.

Figure 5:
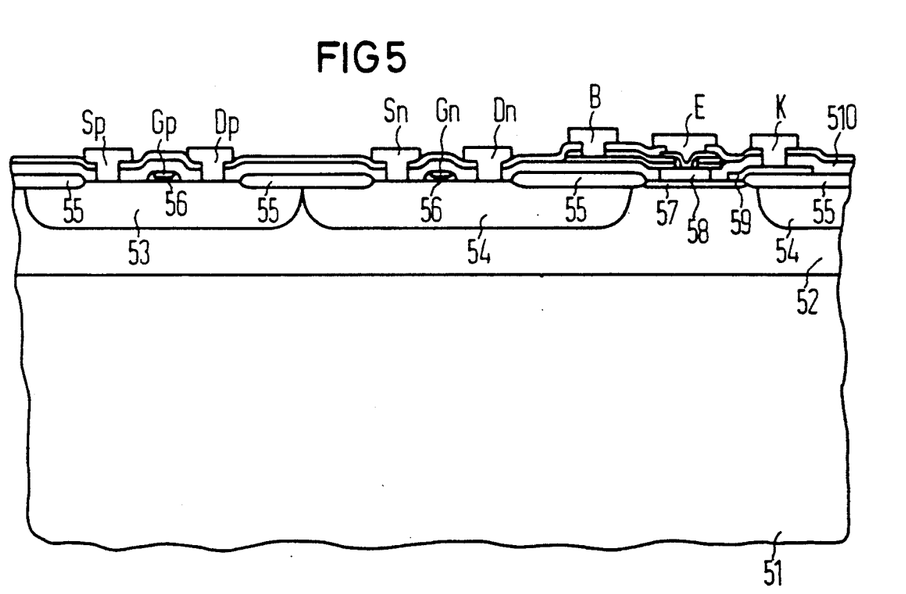
FIG. 5 is a fragmentary, cross-sectional view of a BICMOS configuration including a bipolar transistor according to the invention.

FIG. 5 shows a BICMOS configuration. A $p^-$-doped epitaxial layer 52 is disposed on a $p^-$-doped silicon substrate 51. One n-doped well 53 and two p-doped wells 54 are disposed in the epitaxial layer epitaxial layer 52. Insulating oxide zones 55 are provided on the peripheries of the wells 53, 54 for reliable separation of adjacent transistors. A p-channel transistor, having details which are not shown in the drawing for the sake of simplicity, is disposed in the n-doped well 53. A p-channel transistor has a source contact Sp and a drain contact Dp. The p-channel transistor also has a gate oxide 56 and a gate electrode Gp. An n-channel transistor, having details which are again not shown in the drawing for the sake of simplicity, is disposed in the p-doped well 54. The n-channel transistor has a source contact Sn and a drain contact Dn. The n-channel transistor also has a gate oxide 56 and a gate electrode Gn.

A bipolar transistor according to the invention is disposed on the surface of the epitaxial layer 52 between the p-doped wells 54. The p-doped wells 54 act as channel stopper zones. A subcollector 57 with $n^+$-doping is disposed between the insulating oxide zones. A collector 58 with $n^-$-doping and a buried collector terminal layer 59 are disposed on the subcollector 57. The buried collector terminal layer may be formed of $n^-$-doped polysilicon, for instance. The gate electrodes Gp, Gn are formed of the same material as the buried collector terminal layer, such as $n^-$-doped polysilicon. The gate electrodes Gp and Gn can therefore be produced in the same step as the buried collector terminal layer, which results in a savings of one mask. An insulation layer 510 covers the p-channel transistor, the n-channel transistor and the buried collector terminal layer and it surrounds the collector 58. Contact holes are provided in the insulation layer 510, through which the source contacts Sp, Sn and the drain contacts Dp, Dn are in contact with the respective source and drain regions. A base/emitter complex made by double polysilicon technology, such as of the kind known from A. W. Wieder, in Siemens Forschungs-und Entwicklungsberichte [Research and Development Reports], Vol. 13, 1984, pp. 246 et seq., is disposed on the collector 58.

Etching of the contact holes for the source contacts Sp, Sn, the drain contacts Dp, Dn and the base contact B, the emitter contact E and the collector contact K, can be performed with one mask in one process step.

Since the bipolar transistor is disposed on the surface of the epitaxial layer 52, and since the collector 58 is produced by selective epitaxy, the CMOS components (p-channel transistor and n-channel transistor) can be optimized independently of the bipolar transistor. For a given application, the best p-channel, n-channel and bipolar transistors are combined with one another according to the modular construction principle.

The production of the transistor according to the invention will be described below in further detail, by referring to exemplary embodiments. The exemplary embodiment is based on a 0.4 $\mu$m photolithography with an adjustment tolerance of approximately 0.13 $\mu$m.

Figure 6:
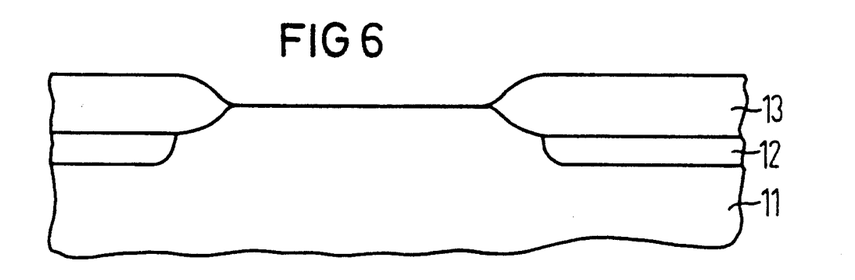
FIGS. 6-15, 16-19, and 20-21 are fragmentary, cross-sectional views showing production steps for various bipolar transistors according to the invention.

In order to produce the bipolar transistor shown in FIG. 1, the channel stopper zones 12 are made in the substrate 11 by implantation, and the insulating oxide zones 13 are made by a LOCOS technique, for instance, as seen in FIG. 6. Weakly p-doped (100) Czochralski silicon is, for instance, used as the substrate 11. The thickness of the insulating oxide zones 13 is 0.4 μm, for instance. The region on the substrate surface 11 uncovered by the insulating oxide zones 13 is $1.6 \times 1.6$ μm$^2$ in size, for example.

Figure 7:
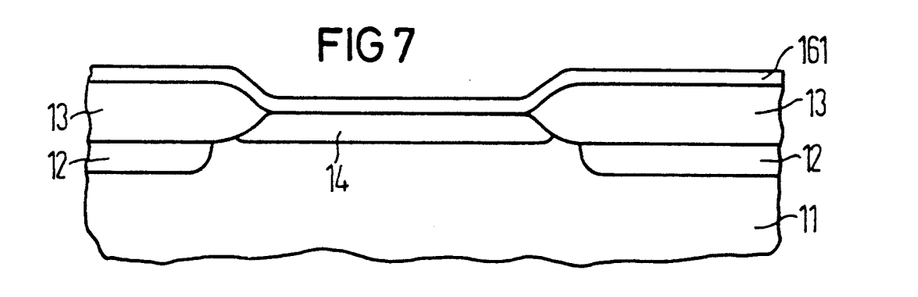

A conductive layer 161 is applied over the entire surface of the structure, as seen in FIG. 7. The conductive layer 161 has a thickness of 150 nm, for example. The conductive layer 161 is formed of a metal silicide, n$^-$-doped polysilicon, a polycide, tungsten, or the like, for instance. The conductive layer 161 is implanted with n-doped ions. In a temperature step, the subcollector 14 is produced by out-diffusion of the dopants from the conductive layer 161 into the semiconductor substrate 11. In the finished transistor, the function of the conductive layer 161 is to connect the subcollector 14 to the conductor tracks.

Figure 8:
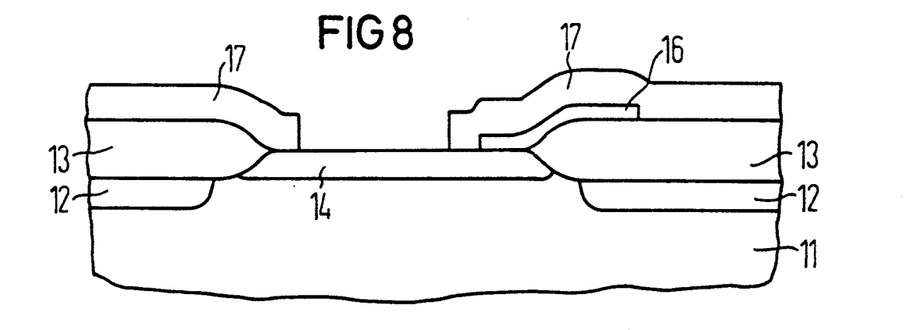

With the aid of a photo technique, the conductive layer 161 is structured in such a way that the buried collector terminal layer 16 is created from it, as seen in FIG. 8. The buried collector terminal layer 16 is disposed on one side of the subcollector 14 in such a way that it extends to the adjoining insulating oxide zone 13. An insulation layer is deposited onto the surface of the structure, to a thickness of 300 nm, for example, over the entire surface. With the aid of a further photo technique, the insulation layer is structured in such a way as to create the insulator structure 17. The insulator structure 17 includes a region in which the surface of the subcollector 14 is exposed.

Figure 9:
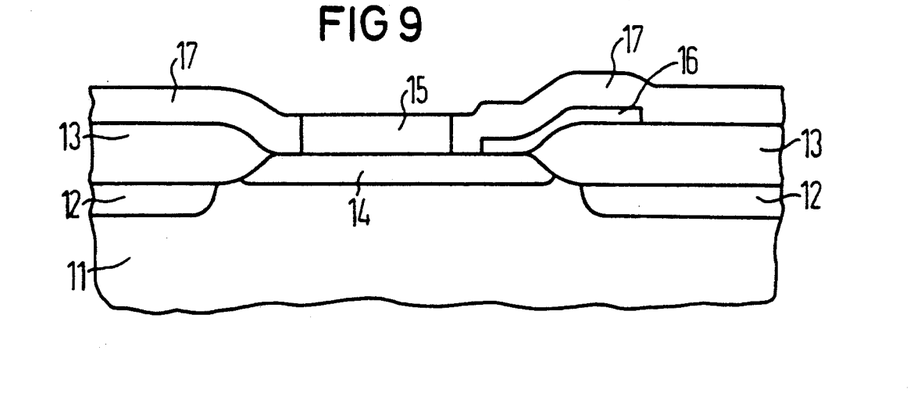

After generally well known cleaning steps required for the selective epitaxy have been performed, the collector 15 is produced on the exposed surface of the subcollector 14 by selective epitaxial deposition, as seen in FIG. 9. The region defined by the insulator structure 17 is filled to the upper edge during this process. The collector 15 is n-doped. The dopant concentration is $2 \times 10^{16}$ cm$^{-3}$, for example.

Figure 10:
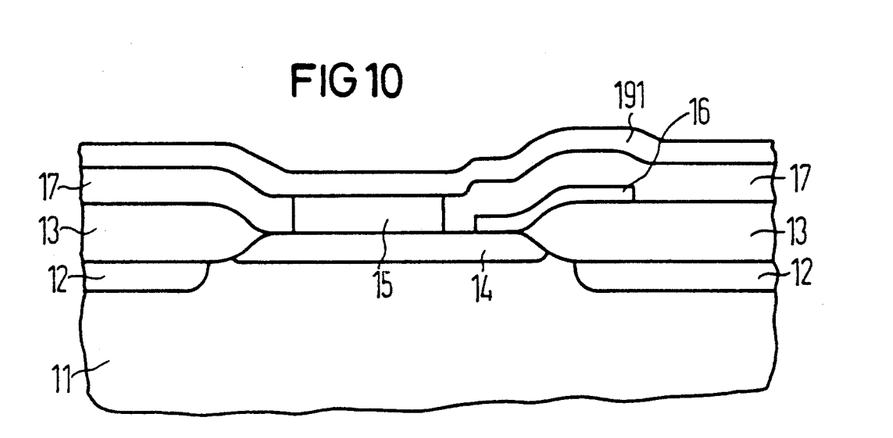

A silicon layer 191 is applied over the entire surface of the structure, as seen in FIG. 10. The silicon layer 191 is implanted with p-doped ions. The thickness of the silicon layer 191 is 150 nm, for example. The silicon layer 191 is deposited in polycrystalline or amorphous form, for instance in an oven. However, for the ensuing production process it is advantageous to deposit the layer over the entire surface in an epitaxy reactor, so that a monocrystalline layer with the crystalline orientation of the collector 15 and thus of the semiconductor substrate 11 is created on the silicon zones, that is on the surface of the collector 15. The deposited silicon material grows in polycrystalline form only on the oxide underlay, or in other words on the insulator structure 17. Proceeding in this way is advantageous in order to assure growth with as few grain boundaries as possible in the base to be selectively deposited later, as seen from the description of FIG. 12.

Figure 11:
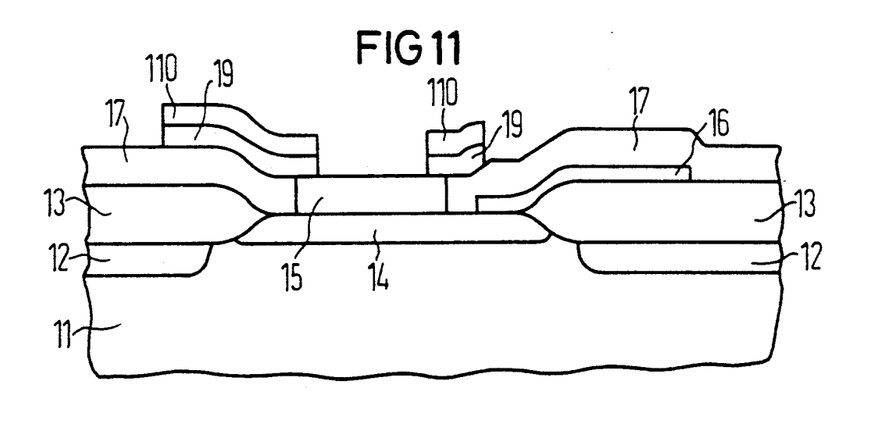

An oxide film is deposited over the entire surface of the silicon layer 191, at a thickness of 150 nm, for instance. Through the use of a photo technique, the double layer including the oxide film and the silicon layer 191 is structured. In this process the silicon layer 191 becomes the base terminal 19. The oxide film becomes part of the oxide film 110 covering the base terminal 19. The base terminal 19 is annular and defines the region for the base and the emitter, as seen in FIG. 11.

Figure 12:
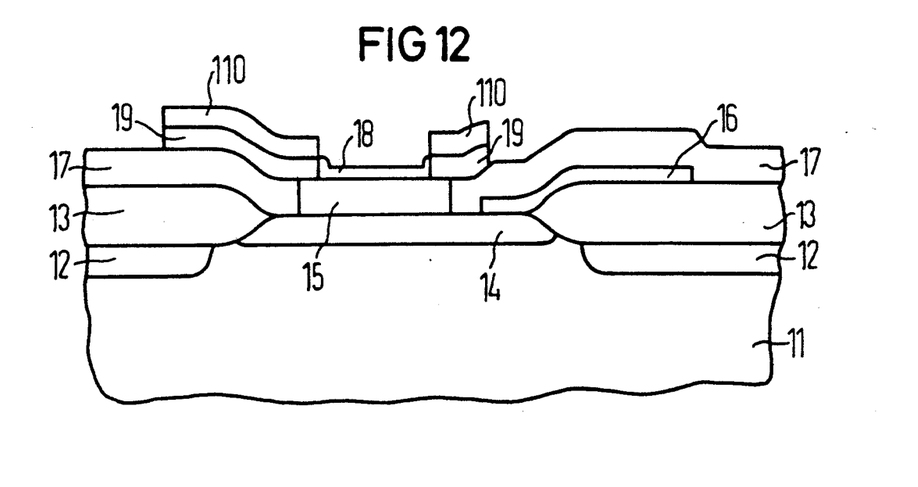

After the cleaning steps required for the selective epitaxy, the p-doped base 18 is deposited selectively in an epitaxy reactor to a layer thickness of 100 nm, for instance, on the collector 15, as seen in FIG. 12. In the selective epitaxy, the base 18 grows both on the surface of the collector 15 and on the adjoining surfaces of the base terminal 19. As already noted in conjunction with FIG. 10, it is advantageous in this case if the silicon layer 191 serving to provide the base terminal is deposited in an epitaxy reactor. In that case, the regions of the base terminal 19 that are disposed directly on the surface of the collector 15 are monocrystalline, and have the orientation of the collector 15. When the base 18 is grown, those regions that grow from the adjoining surfaces of the base terminal 19 then also have defined crystal orientations. Since the base 18 is produced by selective epitaxy, a reduction in the size of the vertical structure of the emitter/base complex is attained by comparison with a base formed by implantation, for example. The base 18 is p-doped.

Figure 13:
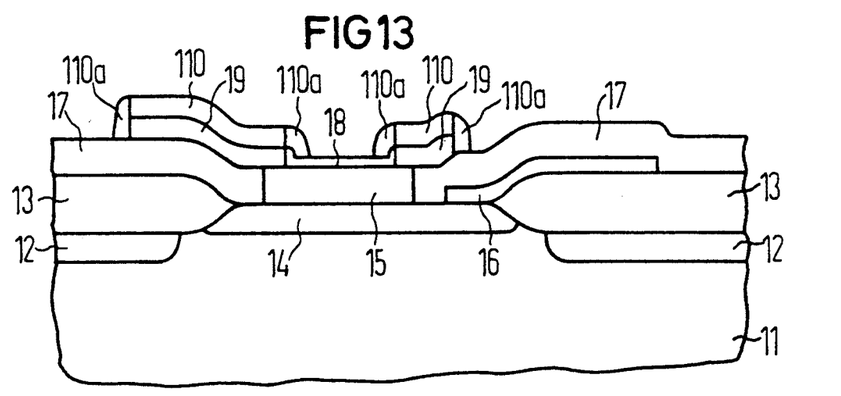

In the next step, spacers 110a are produced on the lateral surfaces of the base terminal 19, as seen in FIG. 13. To this end, a further oxide film is deposited over the entire surface at a thickness of 150 nm, for example, and etched back by an anisotropic dry etching step. The spacers 110a bordering on the base 18 bring about self-alignment of the base terminal 19 with respect to the emitter to be produced. The spacers 110a bordering on the base 18 also shift any grain boundaries forming at the periphery of the base 18 into inactive transistor regions.

Figure 14:
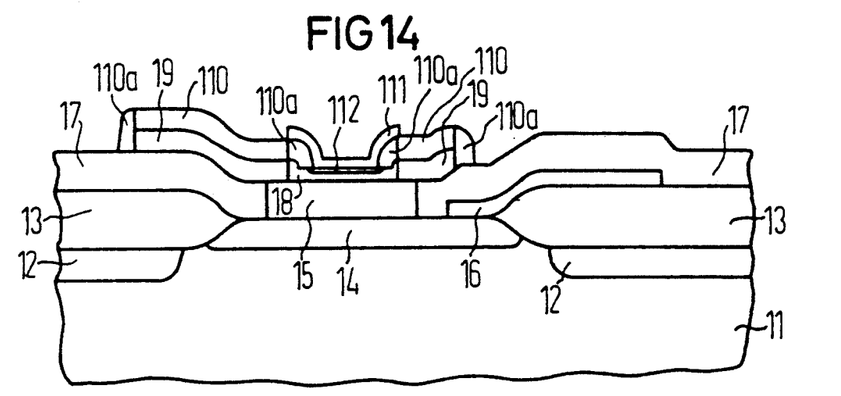
Figure 15:
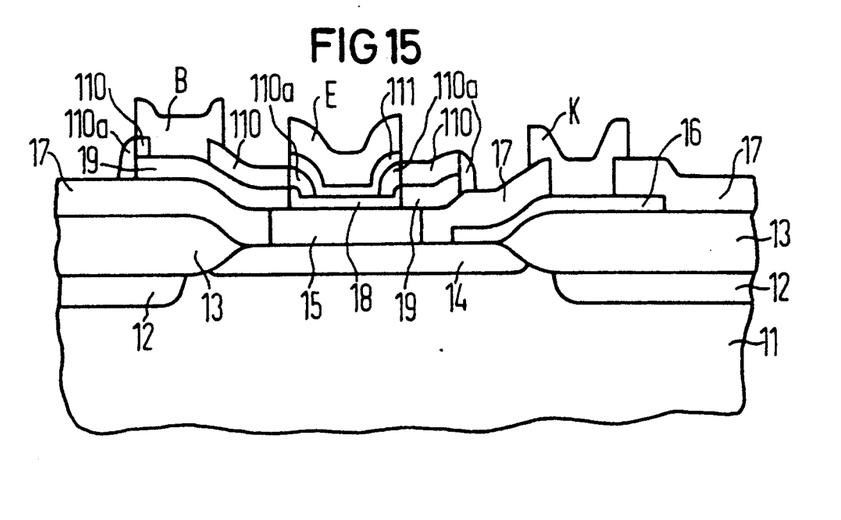

A polysilicon layer is applied to the surface of the structure at a thickness of 100 nm, for instance. The polysilicon layer is implanted with a dose of $\phi = 1 \times 10^{16}$ cm$^{-2}$ with n-doped ions. Structuring of the polysilicon layer, with the aid of an arbitrary photo technique, produces the emitter terminal 111 in such a way that it covers both the spacers 110a bordering on the base 18 and the silicon surface located inbetween them, as seen in FIG. 14. The emitter 112 is produced in a temperature step. The emitter 112 is driven 30 nm deep, for instance, into the monocrystalline silicon beneath it.

With the aid of a photo technique, contact holes for the base and collector terminals are opened in the oxide film 117 and in the insulator structure 17. The base contact B, emitter contact E and collector contact K are produced by metallization.

An exemplary embodiment will be explained below for producing a transistor according to the invention with an annular collector terminal, in which the collector is produced in a self-aligned manner with respect to the collector terminal.

Figure 16:
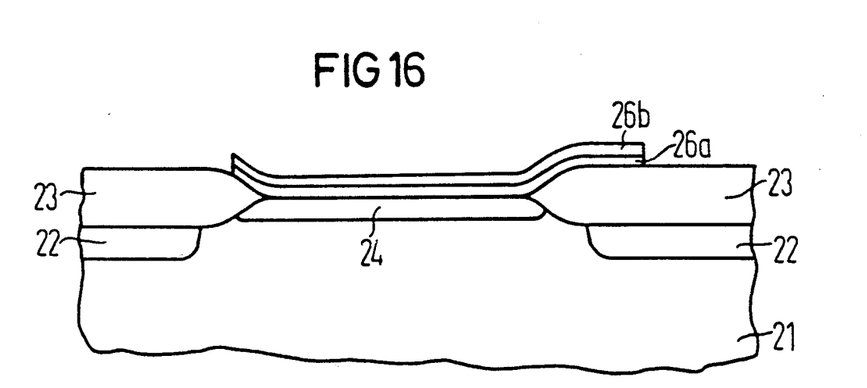

Weakly p-doped (100) Czochralski silicon is used as the substrate 21 seen in FIG. 16. Channel stopper zones 22 are generated in the semiconductor substrate 21 by implantation. The insulating oxide zones 23 are produced, for instance, by a LOCOS technique. The insulating oxide zones 23 have a thickness of 0.4 μm, for instance. Through the use of the insulating oxide zones 23, an exposed surface of the semiconductor substrate 21 that is $-1.6 \times 1.6$ μm$^2$, for instance, is defined.

A polysilicon layer 26a is applied over the entire surface in a thickness of 80 nm, for instance. The polysilicon layer 26a is implanted with a dose of $\phi = 2 \times 10^{16}$ cm$^{-2}$ with n-doped ions. A metal silicide layer 26b having a thickness of 80 nm, for instance, is deposited on the polysilicon layer 26a. The subcollector 24 is produced in a temperature step by out-diffusion from the polysilicon layer 26a into the semiconductor substrate 21

With the aid of a photo technique, the double layer including the polysilicon layer 26a and the metal silicide layer 26b is structured in such a way that it completely covers the subcollector 24 and extends to the lateral surfaces of the adjoining insulating oxide zones 23, as seen in FIG. 16.

Figure 17:
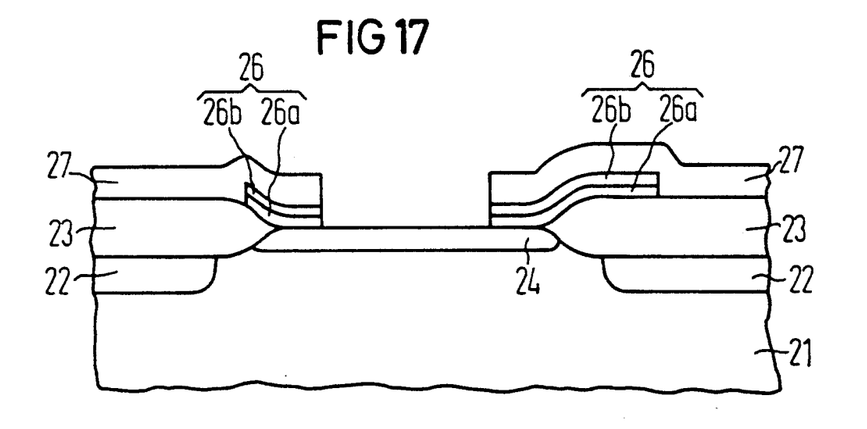

An oxide film is deposited over the entire surface of the structure, to a thickness of 200 nm, for instance. With the aid of a photo technique, the oxide film and the double layer including the polysilicon layer 26a and the metal silicide layer 26b are structured simultaneously. In this structuring operation, the annular, buried collector terminal layer 26 and the insulator structure 27 are produced, as seen in FIG. 17. In the structuring operation, the surface of the subcollector 24 inside the annular buried collector terminal layer 26 and the surface of the insulator structure 27 are exposed.

Figure 18:
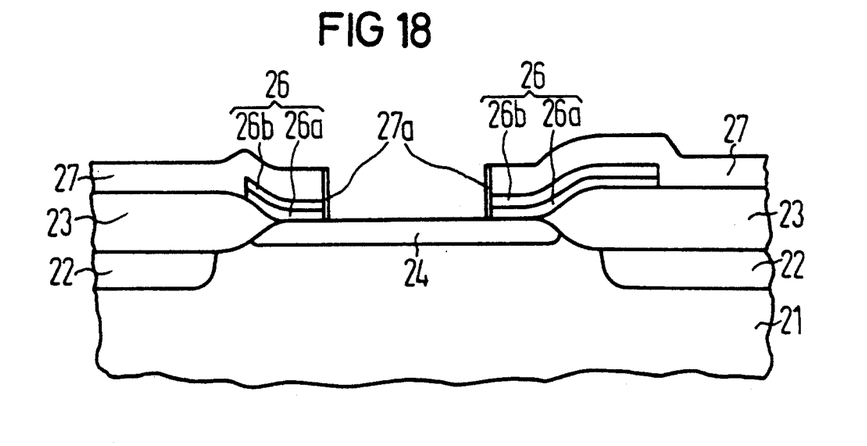

In order to avoid nucleation of silicon atoms on the buried collector terminal layer 26, which is composed of the polysilicon layer 26a and the metal silicide layer 26b, during the ensuing selective epitaxy for producing the collector 25, the lateral surfaces surrounding the exposed region of the subcollector 24 are lined with lateral surface insulators 27a. The lateral surface insulators 27a are formed, for instance, of silicon oxide or silicon nitride, as seen in FIG. 18. If the buried collector terminal layer 26 is formed of a material with low impedance and on which no nucleation of silicon atoms occurs, then these lateral surface insulators can be dispensed with.

Figure 19:
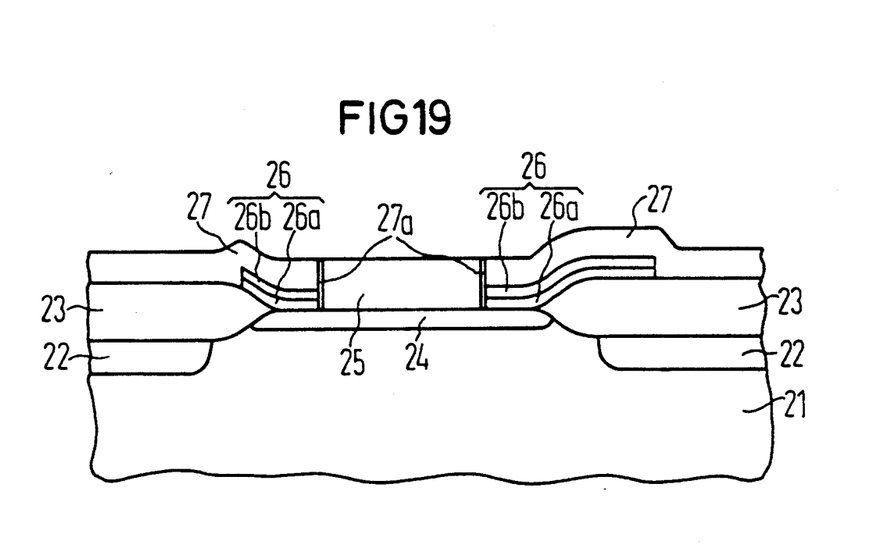

Once the cleaning steps necessary for the selective epitaxy are performed, the n-doped collector 25 is produced by selective epitaxy on the exposed surface of the subcollector 24, as seen in FIG. 19. The collector 25 completely fills the region inside the lateral surface insulators 27a. The insulator structures 27, lateral surface insulators 27a and collector 25 are flush in height.

Various types of the emitter/base complex can be mounted on the structure shown in FIG. 19, which includes the collector with the connected collector terminal. One option is to produce the base/emitter complex analogously to that described in conjunction with FIGS. 10-15. Another option, which leads to the transistor structure shown in FIG. 3, includes producing the emitter/base region by the method known from T. C. Chen et al in IEDM Technical Digest 1988, pp. 740 et seq. and D. L. Harame et al in IEEE Electronic Device Letters, Vol. 10 (1989), pp. 156 et seq..

The production of the collector/collector terminal complex of the embodiment of a bipolar transistor according to the invention as shown in FIG. 4, will be described below.

Figure 20:
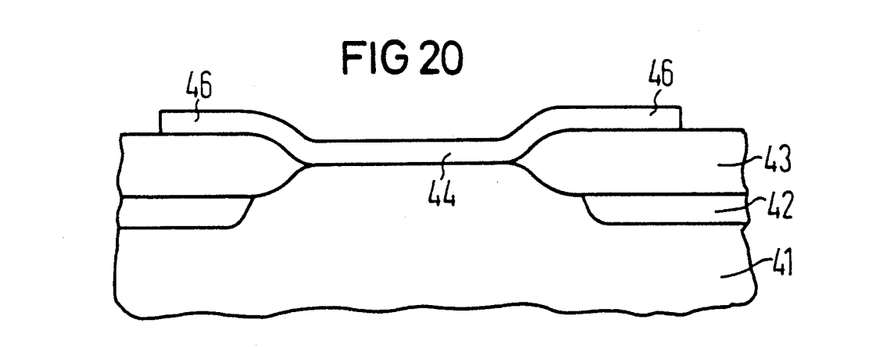

In the semiconductor substrate 41 which, for instance, is formed of weakly p-doped (100) Czochralski silicon, the channel stopper zones 42 are created by implantation and the insulating oxide zones 43 are created by a LOCOS technique, for example. A silicon layer which is 250 nm thick as seen in FIG. 20, for example, is deposited over the entire surface of the structure with in-situ doping in an epitaxy reactor. The silicon layer grows in monocrystalline fashion on the surface of the semiconductor substrate 41 and in polycrystalline fashion on the surface of the insulating oxide zones 43. The dopant concentration in the silicon layer is $1 \times 10^{20}$ cm$^{-3}$, for instance. Since the silicon layer is deposited in doped form, an implantation for doping purposes can be avoided. In implantation, crystal damage always occurs. The crystal quality of the monocrystalline region of the in-situ-doped silicon layer is therefore higher than after doping by implantation. Another option for doping the deposited silicon layer is to apply a further layer to the entire surface (such as glass implanted with n-doped atoms, or oxide). The subcollector 44 and the collector terminal 46 are coated with n-doped atoms through the use of a temperature step. Subsequently, the additionally applied layer (oxide or glass, for example) is eliminated again completely.

The structuring of the silicon layer on the insulating oxide zones 43 takes place with the aid of a photo technique. The monocrystalline portion of the silicon layer, which is disposed on the surface of the semiconductor substrate 41, forms the subcollector 44. The polycrystalline regions of the silicon layer that adjoin the subcollector and are disposed above the insulating oxide zones 43 form the buried collector terminal layer 46.

Figure 21:
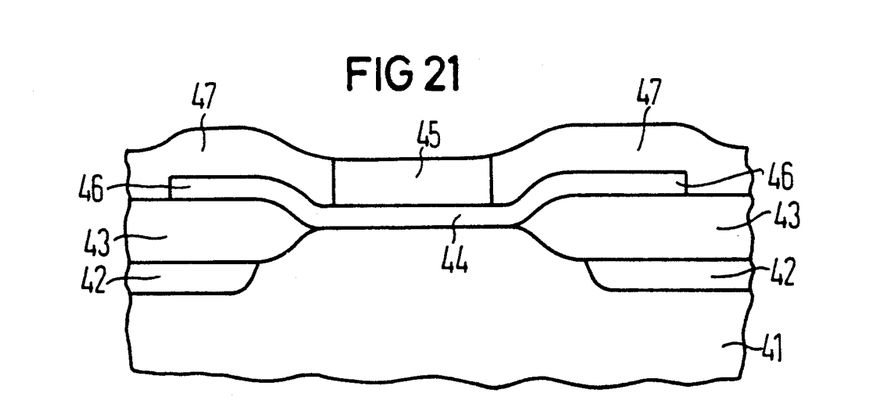

An oxide film having a thickness of 400 nm, for instance, is deposited over the entire surface of the structure. With the aid of a further photo technique, the deposited oxide film is structured, creating the insulator structures 47, as seen in FIG. 21. The surface of the n$^-$-doped subcollector 44 is exposed or layed bare inside the insulator structures 47. After the cleaning steps required for the selective epitaxy, the collector 45 is produced on the exposed surface of the subcollector 44 by selective epitaxy, inside the insulator structures 47. The collector 45 is flush in height with the insulator structure 47.

In this collector/collector terminal complex, the boundary surface between the subcollector 44 and the semiconductor substrate 41 is kept as small as possible. Since this boundary surface contributes to the collector/substrate capacitance, this structure has a reduced collector/substrate capacitance. The buried collector terminal layer 46 in this example is completely buried between the insulating oxide zones 43 and the insulator structures 47. Accordingly, the buried collector terminal layer 46 makes no contribution to the substrate collector capacitance, resulting in a further reduction in the proportion of parasitic capacitance.

One of the possible base/emitter complexes is mounted on the structure shown in FIG. 21 having the finished collector/collector terminal region. A suitable base/emitter complex is that described in conjunction with FIGS. 10-13, is known from T. C. Chen et al in IEDM Technical Digest 1988, pp. 740 et seq.; D. L. Harame et al in IEEE Electronic Device Letters, Vol. 10 (1989), pp. 156 et seq.; and A. W. Wieder, Siemens Forschungs-und Entwicklungsberichte [Research and Development Reports], Vol. 13, 1984, pp. 246 et seq.

An exemplary embodiment of a production process for a BICMOS configuration will not be described. This exemplary embodiment is based on a 0.8 μm photolithography, with an adjustment tolerance of 0.3 μm.

Figure 22:
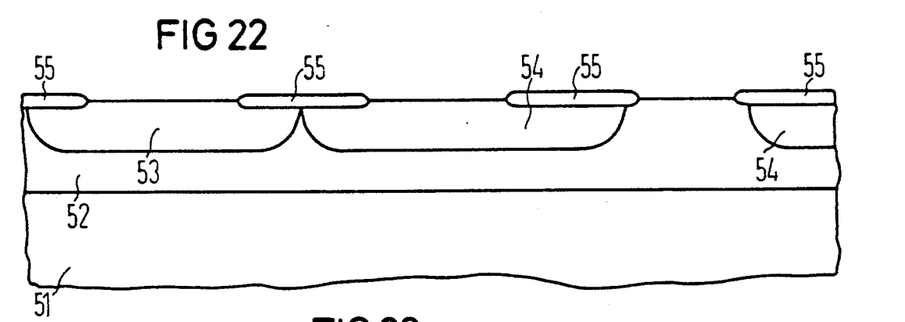
FIGS. 22-25 are fragmentary, cross-sectional views showing production steps for a BICMOS configuration with a bipolar transistor according to the invention.

The epitaxial layer 52 is applied to a p$^-$-doped silicon substrate 51 as a p-doped epitaxial layer. In the epitaxial layer 52, n-doped wells 53 and p-doped wells 54 are produced, for example by production methods known from L.C. Parillo et al in IEDM Technical Digest, 1980, pp. 752 et seq. and M. L. Chen et al in IEDM Technical Digest, 1986, pp. 256 et seq. During the implantation of the p-doped wells 54, the bipolar region is covered with an additional mask, in order to reduce the collector/substrate capacitance. In order to separate active transistor regions, insulating oxide zones 55 are produced, as seen in FIG. 22.

Figure 23:
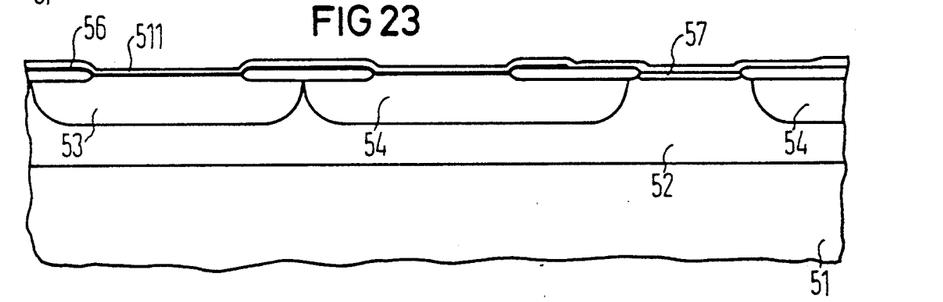

The gate oxide 56 is deposited at a thickness of 20 nm, for example, over the entire surface of the structure, as seen in FIG. 23. With the aid of a photo technique, the gate oxide in the bipolar region is eliminated again. This is followed by the deposition of a polysilicon layer 511 which is 300 nm thick, for instance, and is coated with n-doped atoms. In a temperature step, the subcollector 57 is diffused into the p⁻-doped epitaxial layer 52.

Figure 24:
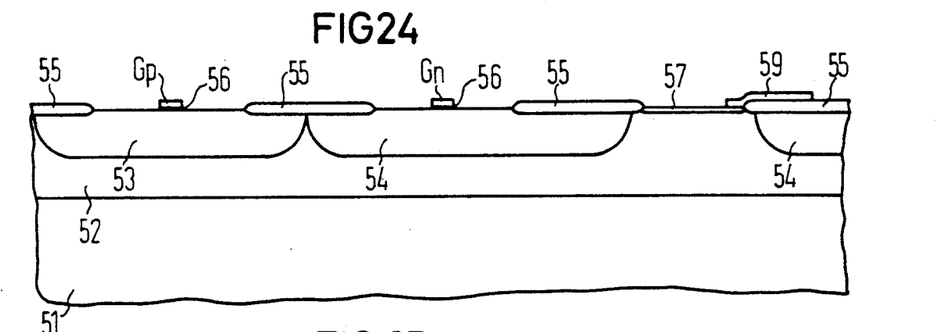

With the aid of a photo technique, the polysilicon layer 511 and the gate oxide 56 are structured jointly, as seen in FIG. 24. In this process the gate electrodes Gp, Gn and the buried collector terminal layer are produced from the polysilicon layer 511. The simultaneous production of the gate electrodes Gp, Gn and the buried collector terminal layer means that one mask is dispensed with.

Figure 25:
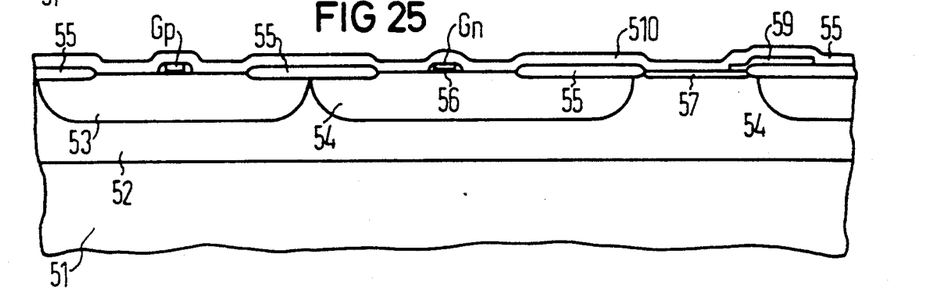

Subsequently, the production of the CMOS transistors is completed, except for the production of the metallization. An insulation layer 510 that is 500 nm thick, for example, is deposited over the entire surface. The insulation layer 510 is formed of silicon oxide, for instance. The insulation layer 510 protects the CMOS transistors from the ensuing process steps for the bipolar production, as seen in FIG. 25.

In the subsequent process steps, the insulation layer 510 is structured in such a way that the insulator structure defining the collector is created. The following process steps may be those that are described above in conjunction with FIGS. 6-14, for example.

After the contact holes have been opened, the CMOS and bipolar transistors are metallized simultaneously. The finished structure is equivalent to that shown in FIG. 5.

We claim:

1. Bipolar transistor having a collector with a bottom surface a base and an emitter disposed in vertical succession, comprising:
    a) a semiconductor substrate, insulating oxide zones disposed in said semiconductor substrate for separating adjacent transistors with an active transistor zone, a buried collector terminal layer at least partly disposed on said insulating oxide zones;
    b) a collector, an insulator structure laterally surrounding said collector, a subcollector being surrounded by said insulating oxide zones, having the same conductivity type with a lower impedance than said collector, being disposed under said collector and under said insulator structure in said substrate, and being electrically connected to said collector;
    c) said insulator structure covering said buried collector terminal layer, laterally insulating said collector from said buried collector terminal layer, and having lateral surfaces extending inside said insulating oxide regions up to said subcollector;
    d) said buried collector terminal layer being in direct contact with said subcollector, and said collector being electrically connected to said buried collector terminal layer only through the subcollector;
    e) said insulator structure having a contact hole formed therein extending to said buried collector terminal layer laterally of said active transistor zone, and a metallization filling said contact hole, wherein said buried collector terminal layer has a lower side with a part disposed on said subcollector and a remainder disposed on said insulating oxide zones, said subcollector has an upper surface connected to said buried collector terminal layer, and the plane defining the lower side of said part of said collector terminal layer disposed on said subcollector falls in a horizontal plane defined by the bottom surface of said collector and wherein said subcollector extends partially into the region covered by said insulating oxide zones, wherein said buried collector terminal layer annularly surrounds said collector, and said buried collector terminal layer annularly adjoins said subcollector.

2. Bipolar transistor according to claim 1, wherein said buried collector terminal layer has a surface, said insulator structure has a portion covering said surface of said buried collector terminal layer and forming a common lateral surface with said buried collector terminal layer, and said insulator structure has a lateral surface insulator covering said lateral surface for assuring lateral insulation between said collector and said buried collector terminal layer.

3. Bipolar transistor according to claim 1, wherein said insulator structure is formed from a continuous layer covering said surface and said lateral surfaces of said buried collector terminal layer by photolithographic definition, for covering said lateral surfaces of said buried collector terminal layer.

4. Bipolar transistor according to claim 1, including:
    a) a simultaneously epitaxially and polycrystallinely grown layer;
    b) said semiconductor substrate having an exposed surface being defined and surrounded by said insulating oxide zones;
    c) said semiconductor substrate having a free surface, said insulating oxide zones having regions adjoining said free surface, said simultaneously epitaxially and polycrystallinely grown layer being disposed on said free surface and said adjoining regions;
    d) said simultaneously epitaxially and polycrystallinely grown layer having a monocrystalline portion disposed above said exposed surface of said semiconductor substrate forming said subcollector;
    e) said simultaneously epitaxially and polycrystallinely grown layer having polycrystalline portions disposed above said insulating oxide zones forming said buried collector terminal layer; and
    f) said collector being completely surrounded by said insulator structure and being disposed only on said monocrystalline subcollector.

5. Bipolar transistor according to claim 1, including a base terminal produced by simultaneous epitaxial and polycrystalline deposition, said base terminal having monocrystalline regions disposed directly on said collector.

* * * * *